United States Patent [19]

Ker et al.

[11] Patent Number: 5,852,315
[45] Date of Patent: Dec. 22, 1998

[54] N-SIDED POLYGONAL CELL LAYOUT FOR MULTIPLE CELL TRANSISTOR

[76] Inventors: Ming-Dou Ker, 11, Ta-Pa, Kuei-Jen, Tainan; Tain-Shun Wu, 104, 3 Ling, Pei-Long, Hou-Long, Miou-Lee; Kuo-Feng Wang, 3F, 26, Lane 43, Yang-Ming Rd., Kau-Shong, all of Taiwan

[21] Appl. No.: 803,916

[22] Filed: Feb. 25, 1997

Related U.S. Application Data

[63] Continuation of Ser. No. 419,637, Apr. 6, 1995, abandoned.

[51] Int. Cl.[6] .................................................. H01L 21/335
[52] U.S. Cl. ........................ 257/355; 257/356; 257/357; 257/358; 257/401; 257/350; 257/351; 257/368; 257/369
[58] Field of Search .................................... 257/335–338, 257/401, 192, 274, 288, 350–351, 368, 369, 371, 382

[56] References Cited

U.S. PATENT DOCUMENTS

| | | | |
|---|---|---|---|
| 4,605,980 | 8/1986 | Hartranft et al. | 361/56 |
| 4,684,967 | 8/1987 | Taylor, Sr. et al. | 257/394 |
| 4,692,781 | 9/1987 | Rountree et al. | 357/23.13 |
| 4,734,752 | 3/1988 | Liu et al. | 357/23.4 |
| 4,745,450 | 5/1988 | Hartranft et al. | 357/23.13 |
| 4,807,080 | 2/1989 | Clark | 361/56 |
| 4,819,046 | 4/1989 | Misu | 357/23.13 |
| 4,896,243 | 1/1990 | Chatterjee et al. | 362/91 |
| 4,939,616 | 7/1990 | Rountree | 361/56 |
| 5,001,529 | 3/1991 | Ohshima et al. | 357/23.13 |
| 5,010,380 | 4/1991 | Avery | 357/23.13 |
| 5,012,317 | 4/1991 | Rountree | 357/38 |
| 5,019,888 | 5/1991 | Scott et al. | 357/41 |
| 5,077,591 | 12/1991 | Chen et al. | 357/23.1 |
| 5,140,401 | 8/1992 | Ker et al. | 357/43 |
| 5,166,089 | 11/1992 | Chen et al. | 437/51 |
| 5,182,220 | 1/1993 | Ker et al. | 437/34 |
| 5,218,222 | 6/1993 | Roberts | 257/362 |
| 5,270,565 | 12/1993 | Lee et al. | 257/358 |
| 5,272,371 | 12/1993 | Bishop et al. | 257/362 |
| 5,274,262 | 12/1993 | Avery | 257/362 |
| 5,289,334 | 2/1994 | Ker et al. | 361/56 |
| 5,329,143 | 7/1994 | Chan et al. | 257/173 |
| 5,336,908 | 8/1994 | Roberts | 257/173 |
| 5,343,053 | 8/1994 | Avery | 257/173 |
| 5,389,810 | 2/1995 | Agata et al. | 257/618 |
| 5,428,238 | 6/1995 | Hayashi et al. | 257/401 |
| 5,429,964 | 7/1995 | Yilmaz et al. | 257/338 |
| 5,432,371 | 7/1995 | Denner et al. | 254/401 |

OTHER PUBLICATIONS

C. Duvvury and A. Amerasekera, "ESD: A Pervasive Reliability Concern for IC Technologies", *Proc. of IEEE*, vol. 81, No. 5.pp. 690–702, May 1993.

A. Amerasekera and C. Duvvury, "The Impact of Technology Scaling on ESD Robustness and Protection Circuit Design", *1994 EOS/ESD Symp. Proc.*, EOS–16, pp. 237–245.

R.N. Rountree, "ESD Protection for Submicron CMOS Circuits: Issues and Solutions", *1988 IEDM Technical Digest*, pp.580–583.

R.N. Rountree, C. Duvvury, T. Maki, and H. Stiegler, "A Process–Tolerant Input Protection Circuit for Advanced CMOS Processes", *1988 EOS/ESD Symp. Proc.* EOS–10, pp. 201–205.

(List continued on next page.)

*Primary Examiner*—Tom Thomas
*Assistant Examiner*—Fetsum Abraham
*Attorney, Agent, or Firm*—Proskauer Rose LLP

[57] ABSTRACT

A MOS transistor cell is disclosed for a multiple cell MOS transistor, such as in an ESD protection circuit, output buffer, etc. The transistor cell has a regular n-sided polygonal geometry, wherein $n \geq 8$. A drain region is provided in a substrate which occupies an area with n-sided polygonal shaped boundaries. Surrounding the drain, is a channel region which occupies an n-sided polygonal shaped area. Surrounding the channel region is a source region provided in the substrate which occupies an annular shaped area having n-sided polygonal boundaries.

33 Claims, 8 Drawing Sheets

OTHER PUBLICATIONS

C. Duvvury, T. Taylor, J. Lindgren, J. Morris, and S. Kumar, "Input Protection Design for Overall Chip Reliability", *1989 EOS/ESD Symp. Proc.*, EOS–11, pp. 190–197.

G. Rieck and R. Manely, "Novel ESD Protection for Advanced CMOS Output Drivers", *1989 EOS/ESD Symp. Proc.*, EOS–11, pp. 182–189.

C. Duvvury and R. Rountree, "A Synthesis of ESD Input Protection Scheme", *1991 EOS/ESD Symp. Proc.*, EOS–13, pp. 88–97.

C.–Y. Wu, M.–D. Ker, C.–Y Lee, and J.Ko, "A New On–Chip ESD Protection Circuit with Dual Parasitic SCR Structures for CMOS VLSI", *1992 IEEE Journal of Solid–State Circuits*, vol. 27, No. 3, pp. 274–280.

M.–D. Ker, C.–Y. Wu, and C.–Y. Lee, "A Novel CMOS ESD/EOS Protection Circuit with Full–SCR Structures", *1992 EOS/ESD Symp. Proc.*, EOS–14, pp. 258–264.

M.–D. Ker and C.–Y. Wu, "CMOS On–Chip Electrostatic Discharge Protection Circuit Using Four–SCR Structures with Low ESD–trigger Voltage", *1994 Solid–State Electronics*, vol. 37, No. 1, pp. 17–26.

A. Chatterjee and T. Polgreen, "A Low–Voltage Triggering SCR for On–Chip ESD Protection at Output and Input Pads", *IEEE Electron Device Letters*, vol. 12, No. 1, pp. 21–22, Jan. 1991.

A. Chatterjee and T. Polgreen, "A Low–Voltage Triggering SCR for On–Chip ESD Protection at Output and Input Pads", *1990 Proc. Symposium on VLSI Technology*, pp. 75–76.

C. Duvvury, R.N. Rountree, and O. Adams, "Internal Chip ESD Phenomena Beyond the Protection Circuit", *IEEE Trans. on Electron Devices*, vol. 35, No. 12, pp. 2133–2139, Dec., 1988.

X. Guggenmos and R. Holzner, "A New ESD Protection Concept for VLSI CMOS Circuits Avoiding Circuit Stress", *1991 EOS/ESD Symp. Proc.*, EOS–13, pp. 74–82.

H. Terletzki, W. Nikutta, and W. Reczek, "Influence of the Series Resistance of On–Chip Power Supply Buses on Internal Device Failure after ESD Stress", *IEEE Trans. on Electron Devices*, vol. 40, No. 11, pp. 2081–2083, Nov., 1993.

C. Johnson, T.J. Maloney, and S. Qawami, "Two Unusual HBM ESD Failure Mechanisms on a Mature CMOS Process", *1993 EOS/ESD Symp. Proc.*, EOS–15, pp. 225–231.

C. Duvvury, R. A. McPhee, D. A. Baglee, and R. N. Rountree, "ESD Protection Reliability in 1–$\mu$m CMOS Technologies", *1986 IRPS Proc.*, pp. 199–205.

S. Daniel and G. Krieger, "Process and Design Optimization for Advanced CMOS I/O ESD Protection Devices", *1990 EOS/ESD Symp. Proc.*, EOS–12, pp. 206–213.

Y. Wei, Y. Loh, C Wang, and C. Hu, "MOSFET Drain Engineering for ESD Performance", *1992 EOS/ESD Symp. Proc.*, EOS–14 pp. 143–148.

T.L. Polgreen and A. Chatterjee, "Improving the ESD Failure Threshold of Silicided n–MOS Output Transistors by Ensuring Uniform Current Flow", *1992 IEEE Trans. Electron Devices*, vol. 39, No. 2, pp. 379–388.

C. Duvvury, C. Diaz, and T. Haddock, "Achieving Uniform nMOS Device Power Distribution for Submicron ESD Reliability", *1992 IEDM Technical Digest*, pp. 131–134.

C. Duvvury, and C. Diaz, "Dynamic Gate Coupling of NMOS for Efficient Output ESD Protection", *1992 Proc. of IRPS*, pp. 141–150.

Baker, R. Currence, S. Law, M. Le, C. Lee, S.T. Lin & M. Teene, "A Waffle Layout Technique Strengthens the ESD Hardness of the NMOS Output Transistor", 1989 EOS/ESD Symp. Proc. EOS–11, pp. 175–181.

Y.–S. Hu, H.–R. Liauh, and M.–C. Chang, "High Density Input Protection Circuit Design in 1.2 $\mu$m CMOS Technology", *1987 EOS/ESD Symp. Proc.*, EOS–9, pp. 179–185.

S.R. Vemura, "Layout Comparison of MOSFETs With Large W/L Ratios" *1992 Electronics Letters*, vol. 28. No. 25, pp. 2327–2329.

N-SIDED POLYGONAL CELL LAYOUT FOR MULTIPLE CELL TRANSISTOR

This is a continuation of application Ser. No. 08/419.637, filed Apr. 6, 1995, now abandoned.

RELATED APPLICATIONS

The following patent applications are assigned to the assignee hereof and contain subject matter related to the subject matter of the present patent application:

1. U.S. patent application Ser. No. 08/419,650, entitled "CMOS On-Chip Four-LVTSCR ESD Protection Scheme", filed on even date herewith for Ming-Dou KER and Tain-Shun WU, 2. U.S. patent application Ser. No. 08/419,686, entitled "CMOS Output Buffer With Enhanced High ESD Protection Capability", filed on even date herewith for Ming-Dou KER and Tain-Shun WU, and 3. U.S. patent application Ser. No. 08/419,638, entitled "Latchup-Free Fully-Protected CMOS On-Chip ESD Protection Circuit", filed on even date herewith for Ming-Dou KER and Tain-Shun WU. The contents of the above-listed patent applications are incorporated herein by reference.

FIELD OF THE INVENTION

The present invention relates to integrated circuit (IC) layout design and fabrication. In particular, the present invention relates to a multiple cell transistor layout design which may be used in electro-static discharge (ESD) protection devices and output buffers.

BACKGROUND OF THE INVENTION

With the improvements in photolithographic resolution, CMOS IC circuit components can be made smaller and smaller. However, as CMOS component features are scaled down to the submicron region, certain advanced CMOS components, such as thinner gate oxides, shorter channel lengths, shallower source/drain junctions, lightly doped drain (LDD) structures, and silicide diffusion regions, can become susceptible to ESD events. See C. Duvvury and A. Ameraskera, ESD: *A Pervasive Reliability Concern for IC Technologies,* PROC. OF IEEE, vol. 81, no. 5, pp.690–702, May 1993; and A. Ameraskera and C. Duvvury, *The Impact of Technology Scaling on ESD Robustness and Protection Circuit Design,* 1994 EOS/ESD SYMP. PROC.,EOS-16, pp.237–245.

FIG. 1 shows a CMOS ESD protection device 10 connected to an input pad 12. As shown, the CMOS ESD protection device includes a PMOS transistor 14 and an NMOS transistor 16 which each have their drains connected, in parallel, to the input pad 12. (Typically, the input pad 12 is connected to a respective pin of the IC chip by a bonding wire.) The input pad is also connected to the internal components of the IC via a resistor 18. When an ESD event occurs, the NMOS and PMOS transistors trigger thereby sinking an ESD voltage which might otherwise damage the internal components of the IC chip.

While the invention is illustrated herein by a CMOS ESD protection circuit, such as is shown in FIG. 1, other types of ESD protection circuits are known which use bipolar junction transistor (BJT) technology. See U.S. Pat. Nos. 5,218, 222, 5,270,565 and 5,272,371. U.S. Pat. No. 5,272,371 shows a BJT ESD protection device that is formed under an input pad. The entire BJT ESD protection device and input pad are laid out in an octagonal shape.

FIG. 2 shows an output buffer 20 for driving a load with an arbitrary impedance. Such output buffers 20 are designed to be able to drive loads with arbitrary impedances at a high current while reducing the transient response caused by parasitic reactances of the IC chip (such as bonding wire inductances). As shown, a signal outputted from a prebuffer of the IC chip is inputted, in parallel, to the gates of a PMOS transistor 24 and an NMOS transistor 26. The PMOS and NMOS transistors 24 and 26 have their drains connected in parallel to the output pad 22. The PMOS and NMOS transistors 24 and 26 output the signal received from the prebuffer to the output pad 22 (which is typically connected to a respective pin via a bonding wire). In so doing, the PMOS and NMOS transistors 24 and 26 drive or sink a current from the output load and the transient parasitic reactances of the IC chip thereby reducing such transient contributions to the response.

To maintain a similar ESD robustness in large scale CMOS ICs, the dimensions of ESD protection devices have conventionally been increased. Likewise, an output buffer with increased dimensions can drive or sink a heavier load. For instance, the dimensions of the NMOS and PMOS transistors can be several hundreds of microns. Output buffers with such large dimensions are commonly provided in low voltage ICs (i.e., drain voltage $V_{DD}$=3.3 V or 2.5 V, etc.).

From a practical standpoint, this presents a problem for high-integration ICs which can have a pin count in excess of 200. In such high pin count ICs, the pad pitch for each pin must be reduced to about 100 $\mu$m. Likewise, the layout area for an ESD circuit associated with each input pad, (including a latchup guard ring which surrounds and isolates the ESD protection circuit), is also limited.

A first layout style for a CMOS ESD protection device is shown in FIG. 3. Such a layout style is referred to as a finger or ladder layout style. Illustratively, the finger layout style is shown for an NMOS transistor although a PMOS transistor may also be implemented using such a finger layout style. As shown, drain 52 and source 54 finger-like regions are interleaved. The interleaved drain and source fingers 52 and 54 are separated by channel regions 56 under gates 58. The finger layout style provides an improvement in MOS transistor performance by increasing the effective channel width to length (W/L) ratio for a given overall layout area of the MOS transistor. (Note that channel length is measured in the direction of channel current flow while channel width is measured perpendicularly thereto.) Such increased performance is reflected by improved ESD robustness or increased output buffer sinking/driving capability.

A second layout style for a CMOS ESD protection device is shown in FIG. 4. Such a layout is referred to as a waffle layout style. See Baker, R. Currence, S. Law, M. Le, S. T. Lin & M. Teene, *A Waffle Layout Technique Strengthens the ESD Hardness of the NMOS Output Transistor,* 1989 EOS/ESD SYMP. PROC. EOS-11, p. 175–181. As shown, the MOS transistor has plural gate lines 60 forming a waffle-like pattern. The gate lines separate source 64 and drain 62 regions from each other. Each drain region 62 is surrounded on four sides by a source region 64. The waffle layout style provides an improvement in MOS transistor performance over the finger layout style shown in FIG. 3. In particular, for symmetrical source and drain regions, the waffle layout style transistor can achieve the same W/L ration as the finger layout style transistor using about 10% less layout area.

Despite these improved layout styles, even more IC chip area reduction is required for ESD protection circuits, output buffers, etc. Recently, the relationship of the dimensions of the MOS transistors and the incidence of MOS transistor failure has been investigated. See S. Daniel & G. Krieger, *Process and Design in Optimization for Advanced CMOS I/O ESD Protection Devices,* 1990 EOS/ESD, Symp. Proc., EOS-12 pp 206–213. These investigations have revealed that the spacing between the drain contact edge and the gate oxide edge is a critical design parameter. This is because most MOS transistor failures tend to occur in this portion of the drain region. The investigations have furthermore revealed that by increasing the spacing between the drain contact and gate oxide edges, the ESD protection capability of an ESD protection device can be improved. Indeed, a minimum spacing of about 5 to 6 $\mu$m in submicron IC technologies tends to provide a desired ESD protection capability. The source contact edge to gate oxide edge need not be as large as the drain contact edge to gate oxide 20 edge spacing, and can be reduced (if possible) to provide an overall space savings in the layout of the MOS transistor.

However, such spacing considerations can be used to optimize the finger layout style transistor but not the waffle layout style transistor. This is because of a geometrical constraint present in the waffle layout style but not the finger layout style. In particular, in the finger layout style, the source contact edge to gate oxide edge spacing can be reduced to about 1 $\mu$m independently of making the drain contact edge to gate oxide edge spacing about 5–6 $\mu$m to achieve an overall savings in area for the layout. However, the layout area occupied by the waffle style layout is fixed by the larger of the drain contact edge to gate oxide edge spacing and the source contact edge to gate oxide edge spacing. Thus, no savings in occupied layout area can be achieved in the waffle style layout by reducing the source contact edge to gate oxide edge spacing. As a result, an optimized finger layout style will occupy less area than a waffle layout style for a given W/L ratio.

Note that in the finger style layout, there is a non-uniform turn-on phenomenon among the finger source and drain regions. That is, some of the source and drain fingers discharge most of the ESD current, while other source and drain fingers remain off. See T. L. Polgreen & A. Chatterjee, *Improving the ESD Failure Threshold of Silicided NMOS Output Transistors by Ensuring Uniform Current Flow,* IEEE TRANS. ELEC. DEVS., vol. 39, no. 2, pp. 379–388 (1992); and C. Duvvury, C. Diaz & T. Haddock, *Achieving Uniform NMOS Device Power Distribution for Sub-Micron ESD Reliability,* 1992 IEDM TECH. DIG., pp. 131–134. Thus, increases in the dimensions of the finger layout style result in smaller improvements in ESD robustness due to the non-uniformity of the current flow among the fingers.

It is an object of the present invention to overcome the disadvantages of the prior art.

SUMMARY OF THE INVENTION

These and other objects are achieved by the present invention which provides a transistor cell with a regular n-sided polygonal shape for a multiple cell CMOS transistor. In the cell, n$\geq$8. For instance, according to one embodiment, the cell includes a drain region provided in a substrate which occupies an n-sided polygonal shaped area. Surrounding the drain, is a channel region which occupies an annular shaped area having n-sided polygonal shaped boundaries. Surrounding the channel region is a source region provided in the substrate which occupies an annular shaped area having n-sided polygonal boundaries.

With such a geometry, the drain and source regions may have arbitrary sizes in regard to one another. Furthermore, (metal) drain and source contacts may be placed on the drain and source regions relative to the gate oxide on the channel, to maximize a drain contact edge to gate oxide edge spacing in a way which achieves an overall savings in the area occupied by the cell. In particular, because of the radial geometrical relationship of the source, gate oxide and drain, the gate oxide may be situated relatively further from the drain contact than the source contact. This takes advantage of the fact that most cell failures tend to occur between the drain contact and gate oxide edges so as to minimize the area occupied by the cell.

In addition, the symmetric geometry of the source, drain and gate tends to make the channel current radially uniform in the cell. Ideally, as n tends towards infinity, the source, drain and gate tend to occupy circular (annular) areas with virtual radially uniform channel current.

Illustratively, the NMOS and PMOS transistors of, for example an ESD protection device, an output buffer, etc., are each formed from multiple cells which are laid out in a two-dimensional array-like pattern on the substrate.

In short, an improved transistor cell layout style is provided which has uniform channel current flow. Furthermore, the drain contact edge to gate oxide edge spacing may be increased, and the source contact edge to gate oxide edge spacing may be decreased, in a fashion which reduces the area occupied by the cell for a desired W/L ratio.

DETAILED DESCRIPTION OF THE INVENTION

Figure 5:
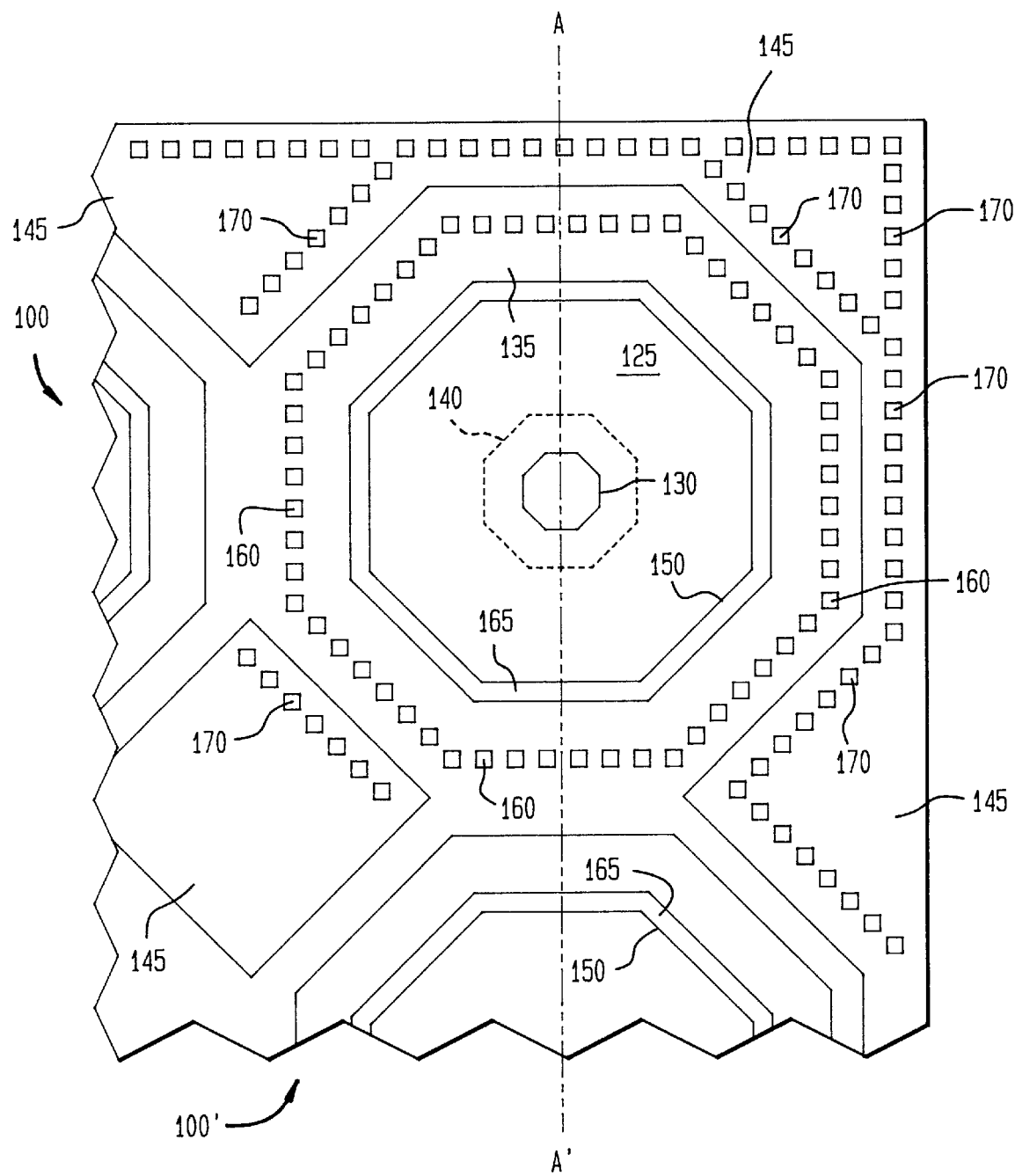
FIG. 5 shows an overhead view of a polygonal layout style according to one embodiment of the present invention.

FIG. 5 shows an overhead view of a MOS transistor cell 100 according to the present invention. Also shown is part of an adjacent MOS transistor cell 100' to illustrate the proximal placement of cells. The area occupied by the cell 100 has a general n-sided regular (i.e., equal length sided) polygonal shape where n$\geq$8. As an illustration, the cell 100 is shown where n=8.

Figure 6:
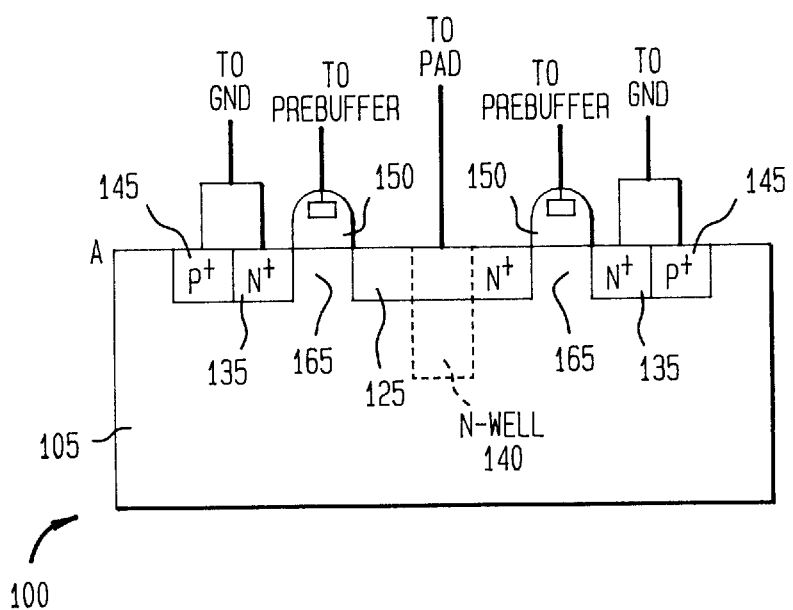
FIG. 6 shows a cross-sectional view of the layout depicted in FIG. 5.
Figure 4:
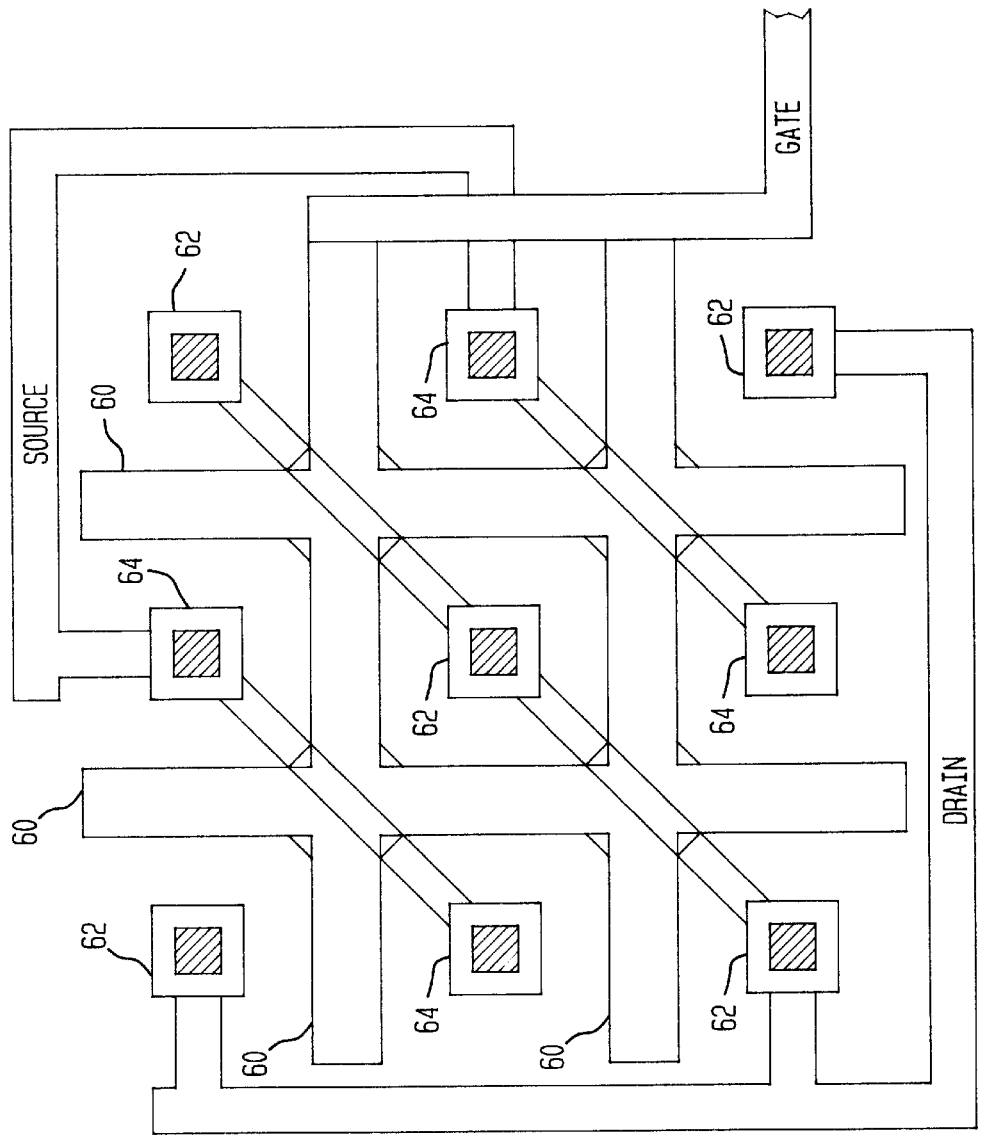
FIG. 4 shows a conventional waffle layout style.

The cell 100 has a central drain contact 130 which occupies an area with a regular n-sided polygonal shape. The drain contact 130 is disposed on a central drain region 125 which is formed in the substrate 105. The central drain region 125 also occupies an area having a regular n-sided polygonal shape. A buried well 140 is provided which extends into the substrate 105 a deeper depth than the drain region 125 (as shown in FIG. 6). The outer boundary of the well 140 is shown in phantom. The buried well also occupies an area having a regular n-sided polygonal shape. Each of the drain 125, drain contact 130 and well regions 140 are centrally located in the cell 100. Illustratively, the drain contact 130 occupies a smaller regular n-sided polygon shaped area than the well 140, which in turn occupies a smaller n-sided polygonal shaped area than the drain region 125.

Surrounding the drain region 125 is a gate 150 which is formed on the substrate over a channel 165 (FIG. 6). Both the gate 150 and channel 165 occupy an annular area with n-sided regular polygonal shaped inner and outer boundaries. Surrounding the annular gate 150 and channel 165 is a source region 135 formed in the substrate 105. Like the gate 150 and channel 165, the source region 135 occupies an annular area with n-sided regular polygonal shaped inner and outer boundaries.

Disposed on the surface of the source region 135 are plural source contacts 160. The source contacts 160 are arranged in an n-sided regular polygonal shaped configuration. Surrounding the source region 135 is a substrate contact region 145. The substrate contact region 145 may have an arbitrary area, such as the peripheral area surrounding the cells 100, 100' of a rectangular layout area incorporating plural cells, including the cells 100, 100'. Substrate contacts 170 are formed on the substrate contact region 145. The substrate contacts are illustratively uniformly distributed around the periphery of the cell 100.

FIG. 6 shows a cross-sectional view of the cell 100 taken along the line A-A'. Illustratively, the cell 100 is an NMOS device of an output buffer although the design is equally applicable to a PMOS device and to an ESD protection device. The fabrication of the cell 100 is as follows. First, a photoresist layer is formed on the substrate 105 surface of the cell 100 and is patterned to expose a regular n-sided polygonal shaped portion of the substrate 105 surface in the vicinity of the N-well 140. The N-well 140 is then formed by implanting ions.

The photoresist is then removed and a thin gate oxide layer is deposited on the substrate 105 surface. A thin polycrystalline silicon gate layer is then deposited on the thin gate oxide layer. The thin gate oxide and thin polycrystalline silicon gate layers are then patterned to expose a regular n-sided polygonal shaped area in the vicinity of the drain 125 and a regular n-sided polygonal shaped annular area in the vicinity of the source 135. An impurity is then diffused into the exposed areas of the substrate to produce self aligned source 135 and drain 125 regions.

Substrate contact region 145 is illustratively formed using a diffusion process that is similar to that used to form regions 125 and 135. Thereafter, another oxide layer is deposited over the thin polycrystalline silicon gates (patterned from the thin polycrystalline silicon layer) and is anisotropically etched to form gate regions 150. After forming the gates 150, metalization contacts 130, 160 and 170 (FIG. 5) are formed. Such metalizations may be formed from materials such as aluminum or tungsten and using a variety of processes such as sputtering.

The MOS transistor cell 100 shown in FIGS. 5–6 has octagonal shaped areas, i.e., n=8. This tends to make the ESD current flow across the channel 165 uniform in the radial direction. Ideally, a circular geometry provides the greatest uniformity. However, most computer aided design (CAD) packages cannot layout such a complex geometric area. In fact, the octagonal shaped layout areas are preferable as they are easily accommodated by most common CAD design tools. As CAD tools and MASK technologies improve in the future, it is desirable to increase n. Note that as n approaches infinity, the n-sided polygonal shaped areas approach circular shaped areas.

Contrast the radial uniformity of current flow using the regular n-sided polygonal layout style according to the present invention to the finger layout style. Whereas the current flow among the fingers in the finger layout style is non-uniform, the current flow in the cell 100 is fairly radially uniform across the channel 165. Thus, each portion of the drain and source regions 125 and 135 contributes approximately equally to ESD or output buffer current sinking/driving.

The radial arrangement of the source 135, gate 150, and drain 125 enables the independent varying of source and drain dimensions. Furthermore, the gate oxide edge of the gate 150 can be located closer to the edge of the source contact 160 than to the edge of the drain contact 130 to achieve an overall savings in layout area occupied by the cell 100. That is, by decreasing the source contact edge to gate oxide edge spacing, the area of the cell 100 can be made smaller without sacrificing the performance of the cell (recall that most MOS transistor failures occur between the drain contact and gate oxide edge). For instance, the distance between the edge of the drain contact 130 and the edge of the gate oxide of gate 150 is approximately 5 $\mu$m while the distance between the edge of the source contacts 160 and the edge of the gate oxide of the gate 150 is approximately 1 $\mu$m.

The purpose of the N-well 140 is to prevent a short circuit from forming between the drain contact 130 and the P-type substrate 105 during an ESD-stress-induced contact spiking event. See C. Duvvury, ESD: *A Pervasive Reliability Concern for IC Technology*, PROC. OF THE IEEE, vol. 81, no. 5, pp. 690–702 May, 1993. ESD failure analysis has revealed that the ESD energy of such spiking to an ESD drain contact often results in melting the drain contact into the ($N^+$) drain diffusion region 125. Under high ESD stresses, this melted metal may rupture the drain's ($N^+$) diffusion region 125 into the (P) substrate 105. This in turn can cause a short circuit effect from the output pad (connected to the drain contact 130) to ground (via the $P^+$ region 145). The N-well 140 reduces the likelihood of such a spiking effect due to its deeper depth within the p-substrate 105 than the drain region 125. The depth of the $N^+$ diffusion drain region 125 is about 0.2~0.3 $\mu$m in the submicron CMOS technology, while the depth of N-well is about 2~3 $\mu$m. If the metal of the contact 130 (FIG. 5) is melted into the $N^+$ diffusion 125 due to the ESD energy, the N-well 140, which is right under the contact 130 (FIG. 5) and is deeper than the drain's $N^+$ diffusion region 125, prevents this melted metal from reaching the p-substrate 105. Thus, the N-well 140 protects the drain contact 130 against contact-spiking.

Figure 7:
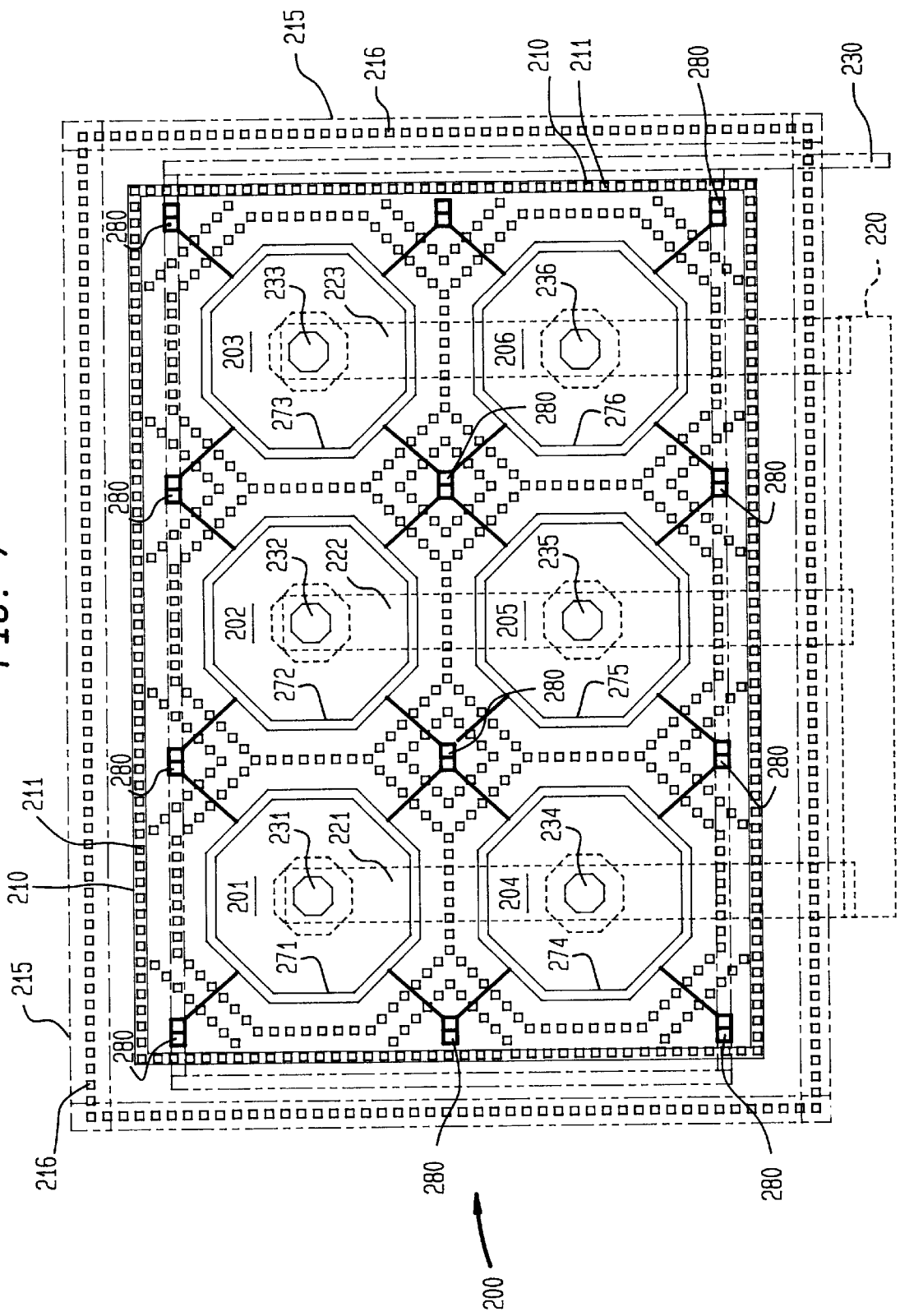
FIG. 7 shows a first multiple cell layout according to the present invention.

Using the basic cell 100, an NMOS (or PMOS) transistor of larger dimensions may be constructed using multiple cells that are illustratively laid out in a two-dimensional array, such as is shown in FIG. 7. As shown in FIG. 7, an NMOS device 200 is provided with six cells 201, 202, 203, 204, 205 and 206. Double latchup guard rings are provided to prevent $V_{DD}$-to-$V_{SS}$ latchup. The first latchup guard ring 210, which is a $P^+$ diffusion region, is connected to ground via contacts 211. The second latchup guard ring 215, which is an $N^+$ diffusion region, is connected to $V_{DD}$ via contacts 216. The latchup guard rings 210, 215 surround the entire NMOS device.

Individual leads 221, 222 and 223 connect the drain contacts 231, 232, 233, 234, 235 and 236 of the cells 201–206 to a pad bus 220. A contact 280 is also provided for connecting the internal circuit (or prebuffer) 230 to the gates 271, 272, 273, 274, 275 and 276. The cells 201–206 collectively form a single NMOS (or PMOS) transistor of, for example, an ESD protection device or output buffer. By forming the transistor from plural cells 201–206 it is possible to increase the ESD robustness (i.e., W/L ratio) of the ESD cell for a given layout area.

Figure 1:
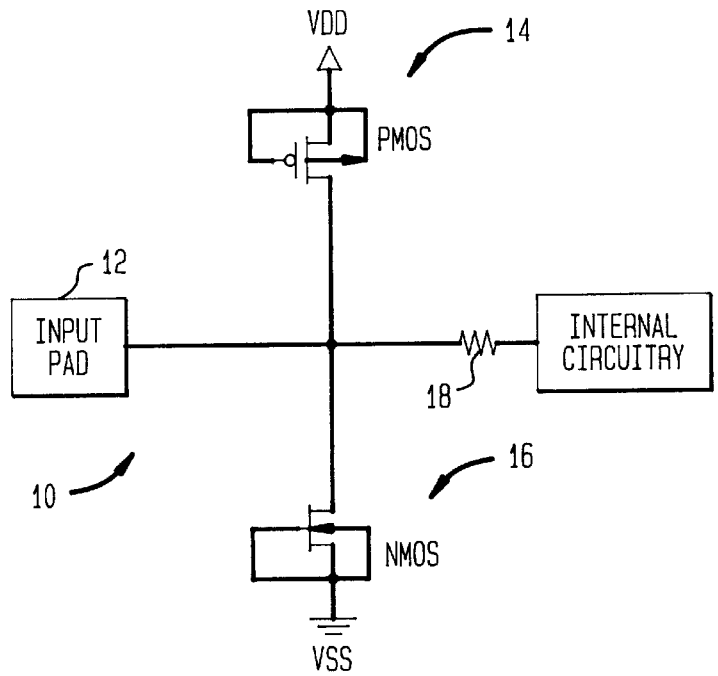
FIG. 1 shows a conventional ESD protection circuit.
Figure 2:
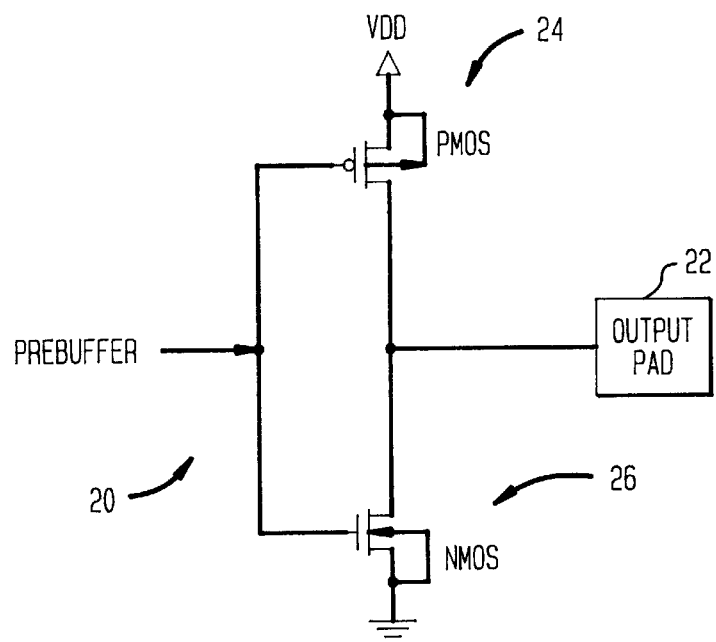
FIG. 2 shows a conventional output buffer circuit.
Figure 8:
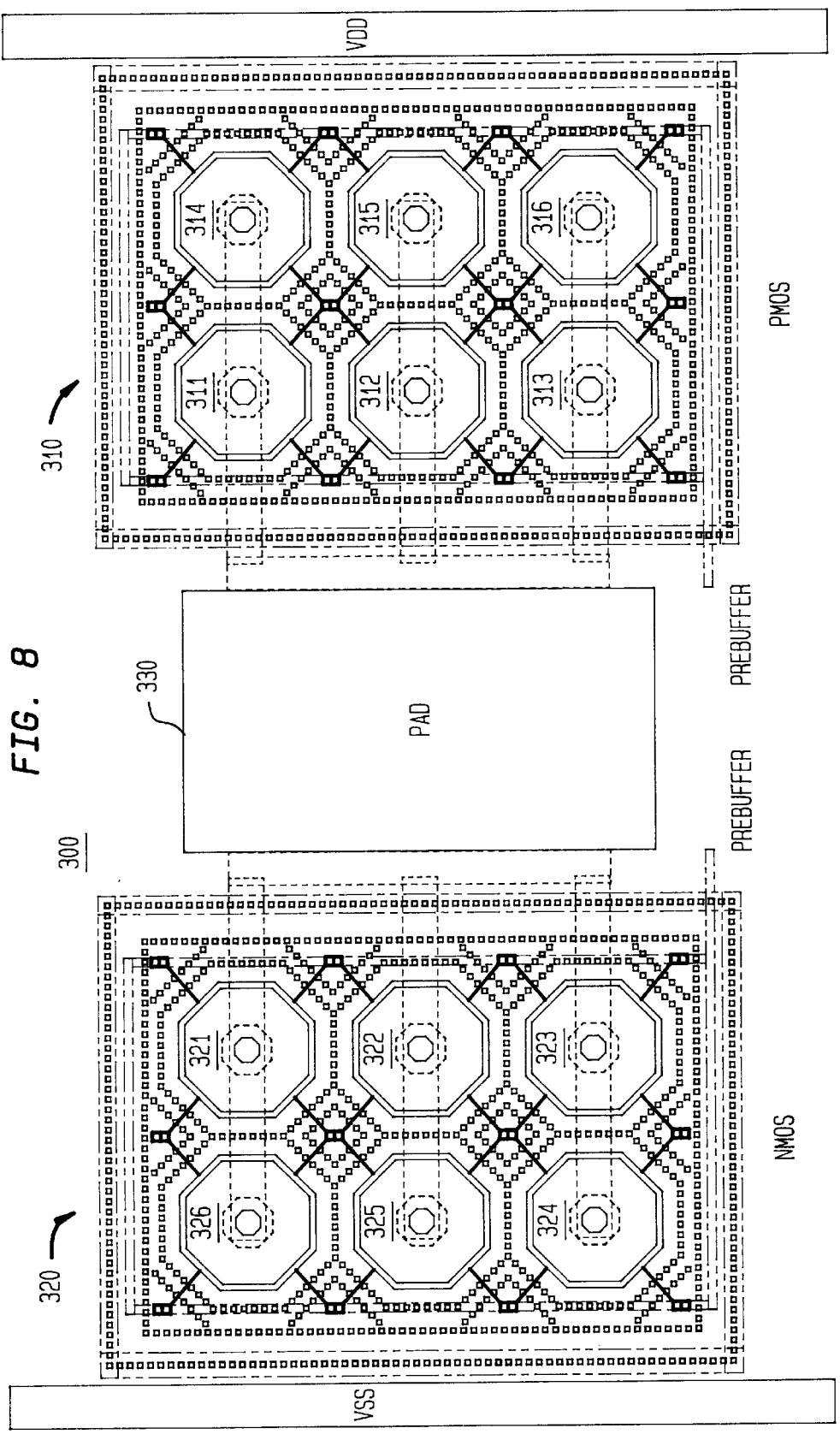
FIG. 8 shows a second multiple cell layout according to the present invention.

FIG. 8 shows a complete layout 300 for an output buffer circuit such as is shown in FIG. 2. The output buffer 300 has a PMOS transistor 310 formed from cells 311–316 and an NMOS transistor 320 formed from cells 321–326. The drains of each cell 311–316 and 321–326 are connected to an output pad 330. Voltage bus lines $V_{SS}$ and $V_{DD}$ are also shown in the layout.

Figure 3:
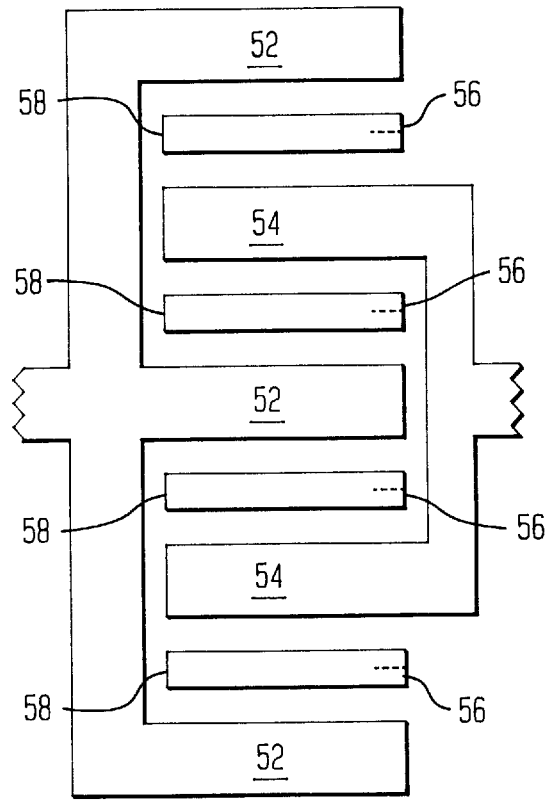
FIG. 3 shows a conventional finger layout style.
Figure 9:
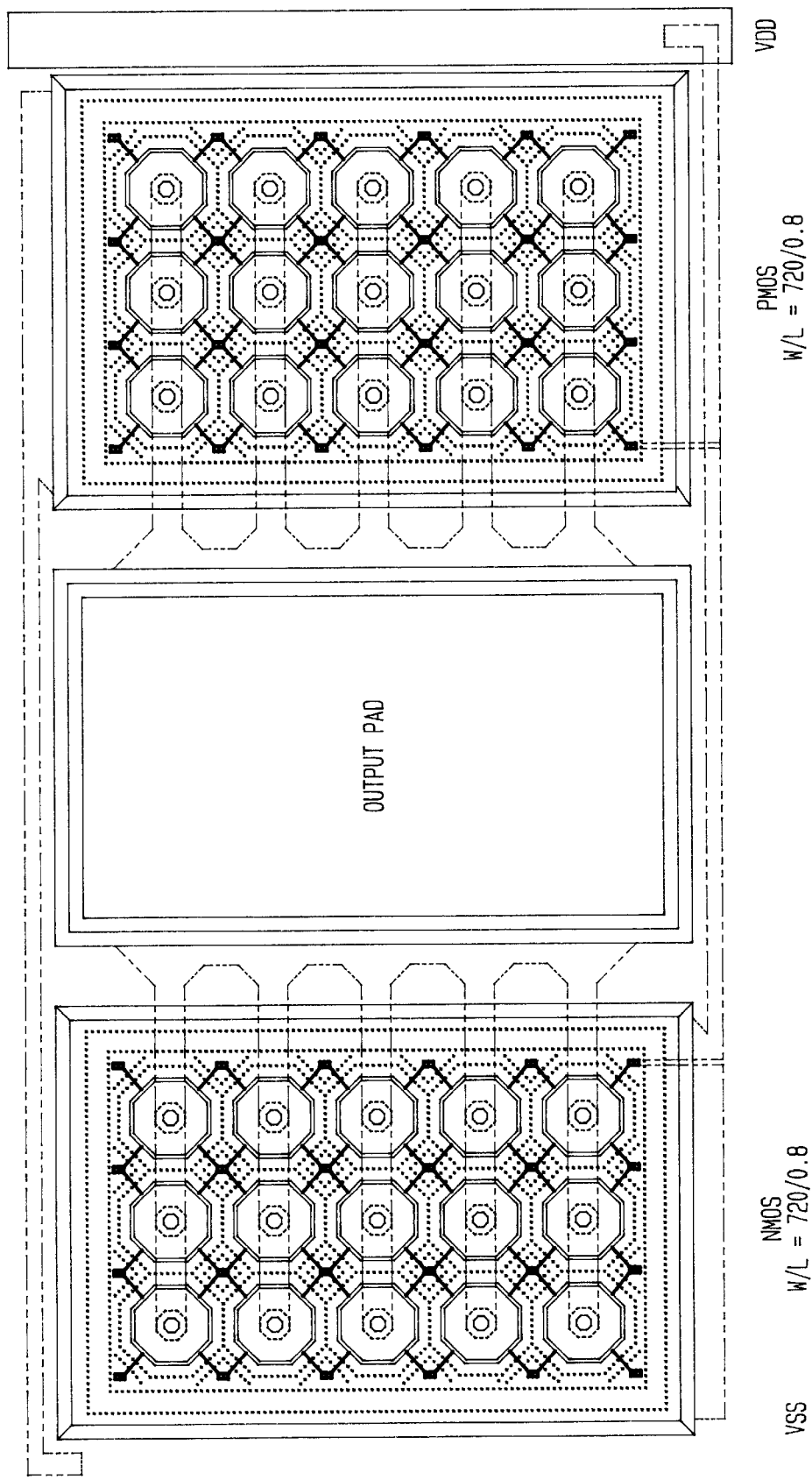
FIG. 9 shows a third multiple cell layout according to the present invention.

FIG. 9 shows yet another output buffer layout 400 wherein the NMOS and PMOS transistors each have fifteen cells. Such a circuit has been implemented for an output buffer in a 0.6 μm CMOS technology with a W/L ratio of 720/0.8 (μm). Table 1 below shows a comparison between the layout of FIG. 9 and a traditional finger layout (FIG. 3).

TABLE 1

|  | Finger (ladder) Layout | N-sided Polygon Layout |
|---|---|---|
| W/L (μm) | 720/0.8 | 720/0.8 |
| Layout area (μm²) | 112 × 100 | 110 × 74 |

Thus, the present invention provides approximately a 30% reduction in layout area over the finger layout style for an equivalent W/L ratio.

Note that the savings in output buffer and ESD protection circuit layout areas enable reducing the cost of the IC chip. Such layout savings can also be used for other transistors within the IC, such as bus drivers. The multiple cell design may also be used to realize other IC components such as thick-oxide devices, lateral BJTs and vertical BJTs.

Note also that the drain diffusion area of the n-sided polygon style is smaller than that of the finger layout style. This in turn decreases the drain-to-bulk parasitic capacitance at an output node (in an output buffer). Thus, the n-sided polygon layout style is more suitable for CMOS output buffers in high speed CMOS IC chips.

Figure 10:
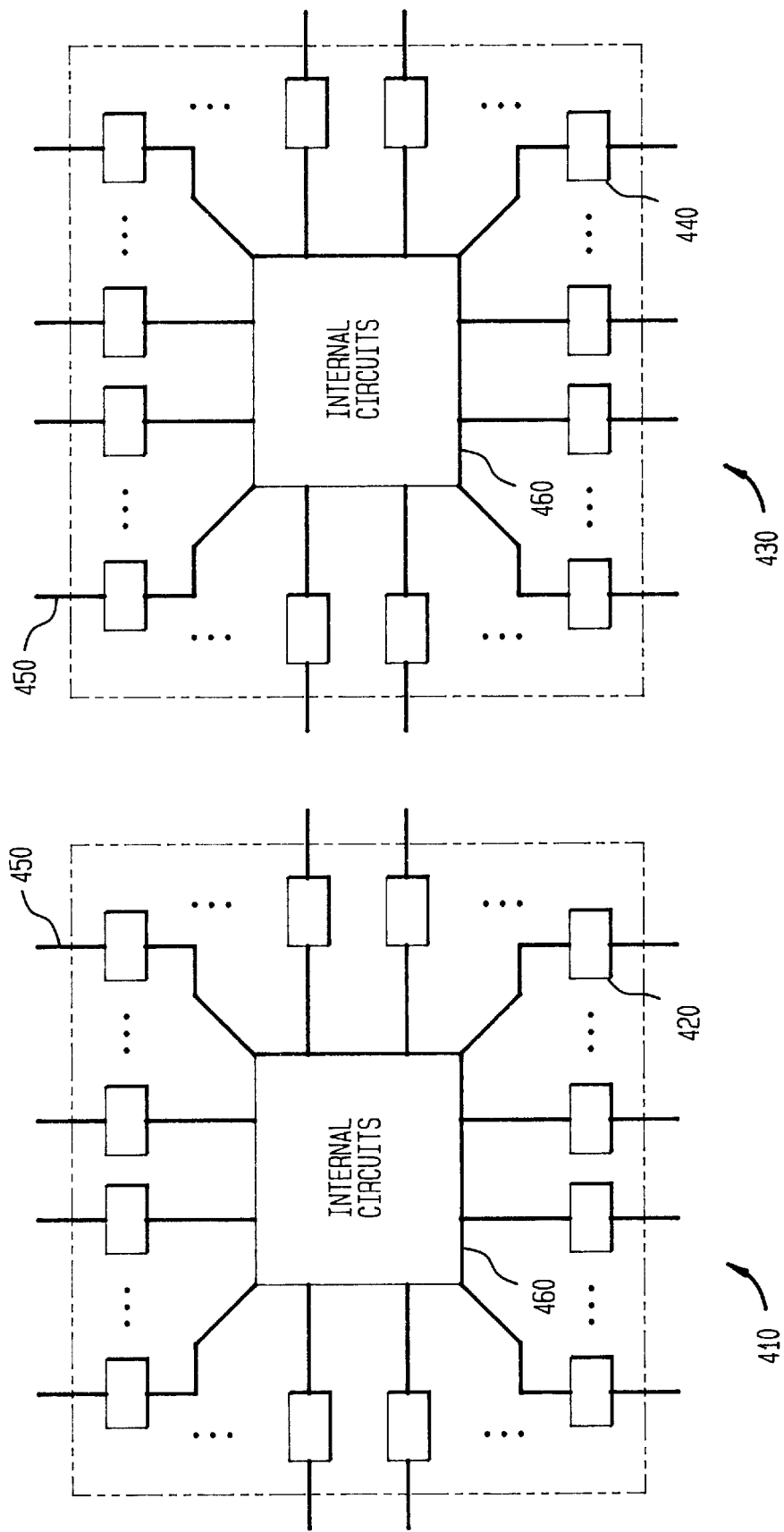
FIG. 10 shows one IC using conventional pads and another IC using pads according to the present invention.

Despite a high pin requirement, which is dictated by the functions of the IC, a minimum total layout area is needed for implementing the inventive ESD protection circuit of output buffer connected to input or output pads. FIG. 10 compares an IC layout 410 with conventional input/output pads 420 with an IC layout 430 incorporating input/output pads 440 having the inventive ESD protection circuits or output buffers. The pads 420, 440 are connected to the internal circuits 460 of the IC. Both the layouts 410, 430 have the same number of pins 450, however, the layout 430 has a reduced total layout area. This is because the layout area of each pad 440, having the inventive ESD protection circuits or output buffers, is reduced by approximately 30% from the conventional pads 420.

In short, a regular n-sided polygonal shaped layout for multiple cell transistors is provided, where n≧8. The inventive layout provides a uniform channel current flow. Furthermore, the invention permits increasing the drain contact edge to gate oxide edge spacing and decreasing the source contact edge to gate oxide edge spacing to reduce the area requirements of the cell.

Finally, the above discussion is intended to be merely illustrative. Numerous alternative embodiments may be provided without departing from the spirit and scope of the following claims.

The claimed invention is:
1. A MOS cell, comprising:
   (a) a drain region formed in a substrate and occupying a regular n-sided polygonal shape, where n≧8;
   (b) a channel region surrounding said drain region and occupying an annular shape with n-sided polygonal shaped boundaries;
   (c) a source region formed in said substrate, surrounding said channel region and occupying an annular shape with n-sided polygonal shaped boundaries; and
   (d) a well of the same conductivity type as said drain region formed in said substrate below said drain region and having n-sided polygonal shaped boundaries.
2. The MOS cell of claim 1, further comprising:
   (a) a drain contact formed on said drain;
   (b) a source contact formed on said source; and
   (c) a gate oxide formed on said channel;
wherein a spacing between said drain contact and said gate oxide is maximized and a spacing between said source contact and said gate oxide is minimized so as to reduce a total area occupied by said cell.
3. The MOS cell of claim 2, wherein the drain contact and the source contact are formed on a same surface of the MOS cell.
4. The MOS cell of claim 2, wherein the drain contact has said n-sided polygonal shape.
5. The MOS cell of claim 2, wherein the source contact comprises a number of contacts arranged in an n-sided polygonal ring.
6. The MOS cell of claim 1, wherein said channel region is configured so that a flow of current across said channel region is radially uniform.
7. The MOS cell of claim 1, wherein said MOS cell is part of an ESD protection circuit.
8. The MOS cell of claim 1, wherein said MOS cell is part of an input or output buffer circuit.
9. The MOS cell of claim 1, wherein said MOS cell is an NMOS cell.
10. The MOS cell of claim 1, wherein said MOS cell is a PMOS cell.
11. The MOS cell of claim 1, wherein the cell is a complementary MOS (CMOS) cell.
12. The MOS cell of claim 1, wherein the channel region has inner and outer boundaries, each of which have said n-sided polygonal shape.
13. The MOS cell of claim 1, wherein the source region has inner and outer boundaries, each of which have said n-sided polygonal shape.
14. The MOS cell of claim 1, wherein the drain region occupies a substantially solid regular n-sided polygonal shape.
15. A multiple cell transistor, comprising:
   a plurality of identical cells having commonly connected identical regions, each of said cells comprising:
   (a) a drain region formed in a substrate and occupying a regular n-sided polygonal shape, where n≧8;
   (b) a channel region surrounding said drain region and occupying an annular area having regular n-sided polygonal shaped boundaries;
   (c) a source region formed in said substrate, surrounding said channel region and occupying an annular area having regular n-sided polygonal shaped boundaries; and
   (d) a well of the same conductivity type as said drain region formed in said substrate below said drain region and having n-sided polygonal shaped boundaries.

16. The multiple cell transistor of claim 15, wherein said plurality of cells form an NMOS device, said multiple cell transistor further comprising a second plurality of identical cells forming a PMOS device having commonly connected identical regions, each cell of said second plurality comprising:

(a) a drain region formed in a substrate and occupying a regular n-sided polygonal shape, where $n \geq 8$;

(b) a channel region surrounding said drain region and occupying an annular area having regular n-sided polygonal shaped boundaries; and (c) a source region formed in said substrate, surrounding said channel region and occupying an annular area having regular n-sided polygonal shaped boundaries.

17. The multiple cell transistor of claim 15, wherein each cell is a complementary MOS (CMOS) cell.

18. The multiple cell transistor of claim 15, wherein the channel region has inner and outer boundaries, each of which has said n-sided polygonal shape.

19. The multiple cell of claim 15, wherein the source region has inner and outer boundaries, each of which has said n-sided polygonal shape.

20. The multiple cell transistor of claim 15, wherein the drain region occupies a substantially solid regular n-sided polygonal shape.

21. The multiple cell transistor of claim 15, wherein each cell has a drain contact and a source contact, the drain and source contacts being formed on a same surface of the cell.

22. The multiple cell transistor of claim 21, wherein the drain contact has said n-sided polygonal shape.

23. The multiple cell transistor of claim 21, wherein the source contact comprises a plurality of contacts arranged in an n-sided polygonal ring.

24. An IC chip, comprising a multiple cell transistor formed from a plurality of identical cells having commonly connected identical regions, each of said cells comprising:

(a) a drain region formed in a substrate and occupying a regular n-sided polygonal shape, where $n \geq 8$;

(b) a channel region surrounding said drain region and occupying an annular area having regular n-sided polygonal shaped boundaries;

(c) a source region formed in said substrate, surrounding said channel region and occupying an annular area having regular n-sided polygonal shaped boundaries; and (d) a well of the same conductivity type as said drain region formed in said substrate below said drain region and having n-sided polygonal shaped boundaries.

25. The IC chip of claim 24, further comprising a pad connected to said multiple cell transistor.

26. The IC chip of claim 24, further comprising a second multiple cell transistor formed from a plurality of identical cells having commonly connected identical regions, each of said cells comprising:

(a) a drain region formed in a substrate and occupying a regular n-sided polygonal shape, where $n \geq 8$;

(b) a channel region surrounding said drain region and occupying an annular area having regular n-sided polygonal shaped boundaries;

(c) a source region formed in said substrate, surrounding said channel region and occupying an annular area having regular n-sided polygonal shaped boundaries; and (d) a pad connected to both of said multiple cell transistors.

27. The IC of claim 11, wherein each cell is a complementary MOS (CMOS) cell.

28. The IC of claim 24, wherein the channel region has inner and outer boundaries, each of which has said n-sided polygonal shape.

29. The IC of claim 24, wherein the source region has inner and outer boundaries, each of which has said n-sided polygonal shape.

30. The IC of claim 24, wherein the drain region occupies a substantially solid regular n-sided polygonal shape.

31. The IC claim 24, wherein each cell has a drain contact and a source contact, the drain and source contacts being formed on a same surface of the cell.

32. The IC of claim 31, wherein the drain contact has said n-sided polygonal shape.

33. The IC of claim 31, wherein the source contact comprises a number of contacts arranged in an n-shaped polygonal ring.

* * * * *

UNITED STATES PATENT AND TRADEMARK OFFICE
CERTIFICATE OF CORRECTION

PATENT NO. : 5,852,315
DATED : December 22, 1998
INVENTOR(S) : Ming-Dou KER, et al.

It is certified that error appears in the above-identified patent and that said Letters Patent is hereby corrected as shown below:

The title page:

The Assignee should read:
Industrial Technology Research Institute

Signed and Sealed this

Sixteenth Day of January, 2001

Attest:

Q. TODD DICKINSON

Attesting Officer

Commissioner of Patents and Trademarks